United States Patent
Su

(10) Patent No.: US 9,371,224 B2
(45) Date of Patent: Jun. 21, 2016

(54) SILICON ETCHING METHOD

(71) Applicant: CSMC TECHNOLOGIES FAB1 CO., LTD., Jiangsu (CN)

(72) Inventor: Jiale Su, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/411,931

(22) PCT Filed: Sep. 3, 2013

(86) PCT No.: PCT/CN2013/082885
§ 371 (c)(1),
(2) Date: Dec. 30, 2014

(87) PCT Pub. No.: WO2014/044122
PCT Pub. Date: Mar. 27, 2014

(65) Prior Publication Data
US 2015/0140823 A1    May 21, 2015

(30) Foreign Application Priority Data
Sep. 18, 2012  (CN) .......................... 2012 1 0346875

(51) Int. Cl.
*B81C 1/00* (2006.01)
*H01L 21/308* (2006.01)

(52) U.S. Cl.
CPC ......... *B81C 1/00396* (2013.01); *B81C 1/00626* (2013.01); *H01L 21/3086* (2013.01); *B81B 2203/033* (2013.01); *B81C 2201/0132* (2013.01)

(58) Field of Classification Search
CPC ............ B81C 1/00396; B81C 1/00626; B81C 2201/0132; H01L 21/3086; H01L 2924/00; H01L 2924/00014; H01L 2224/32225; H01L 2924/0002; H01L 2924/10253; H01L 2224/16225; H01L 23/481; H01L 27/10876; H01L 21/31144; H01L 2225/06541; H01L 21/76898; H01L 23/3192; H01L 21/31111; H01L 21/31116; H01L 21/76802; H01L 21/76829; H01L 23/53295; H01L 21/3065; H01L 21/31138; B81B 2203/033
USPC ....................................................... 438/700
See application file for complete search history.

(56) References Cited

U.S. PATENT DOCUMENTS

| 2001/0045527 | A1 | 11/2001 | Wissman et al. |
| 2002/0102775 | A1* | 8/2002 | Houng ............. H01L 21/02052 438/143 |

(Continued)

FOREIGN PATENT DOCUMENTS

| CN | 1336573 A | 2/2002 |
| CN | 102569116 A | 7/2012 |
| JP | S62234340 A | 10/1987 |

OTHER PUBLICATIONS

International Search Report dated Dec. 12, 2013.

*Primary Examiner* — Caleen Sullivan
(74) *Attorney, Agent, or Firm* — Polsinelli PC

(57) ABSTRACT

A silicon etching method of etching a silicon substrate to form silicon trenches having different width dimensions includes: S1, providing a silicon substrate; S2, depositing a mask layer on the silicon substrate; S3, corroding the mask layer to form windows having different width dimensions, wherein a mask layer having a certain thickness is reserved at least at a bottom portion of a window having a non-minimum width dimension, such that all the silicon trenches have the same depth after step S4; and S4, corroding the mask layer at the bottom portion of the window and the silicon substrate to form the silicon trenches. The mask layer having a certain thickness is reserved at the bottom portion of the window having the non-minimum width dimension, a relatively large window is protected, and a relatively small window is etched first, so that the finally obtained silicon trenches have the same depth.

12 Claims, 2 Drawing Sheets

(56) References Cited

U.S. PATENT DOCUMENTS

| | | | | |
|---|---|---|---|---|
| 2004/0192031 A1* | 9/2004 | Baier | ............... | H01L 21/31144 438/638 |
| 2006/0021704 A1* | 2/2006 | Saita | ............... | H01L 21/3065 156/345.47 |
| 2006/0054590 A1* | 3/2006 | Krawczyk | ............... | B41J 2/1603 216/27 |
| 2009/0072355 A1* | 3/2009 | Cheng | ............... | H01L 21/76232 257/622 |

* cited by examiner

SILICON ETCHING METHOD

CROSS-RELATED TO RELATED APPLICATIONS

This application is a National Phase filing under 35 U.S.C. §371 of PCT/CN2013/082885 filed on Sep. 3, 2013, which claims priority of Chinese Patent Application Serial No. 201210346875.8 filed on Sep. 18, 2012 the entire contents of which are hereby incorporated by reference in their entireties.

FIELD OF THE INVENTION

The present disclosure relates to a field of Micro-Electra-Mechanical System (MEMS) processing, and more particularly relates to a method of etching on a surface of a silicon substrate.

BACKGROUND OF THE INVENTION

Micro-Electro-Mechanical System (MEMS) is a miniaturized system developed based on microelectronic technology. It is a micro integrated system that integrates physical, chemical and biological sensors (configured to perform information obtaining), actuators, and information processing and storage. Micro sensors, micro actuators, micro elements, micro mechanical optical electromechanical devices, vacuum microelectronic devices, and, power electronic devices manufactured by MEMS technology are widely used in aviation, aerospace, automobile, biomedicine, environmental monitoring, military affairs and almost all fields that men can expose.

Photolithograph is a processing step that appeared most often in the MEMS device manufacturing process, the quality and accuracy of photo lithograph directly affects the quality and accuracy of subsequent processes. Photolithograph can be divided into planar lithography and stereo lithography according to its spatial character.

MEMS photolithographic technology is developed based on integrated circuit (IC) technology. Firstly, photoresist (PR) is coated on a substrate, and a pattern on a mask is transferred on the substrate via exposure, developing and so on. The pattern of the photo resist can also be the mask for the subsequent process, being corroded and ion implanting, and finally the layer of photo resist is removed. After decades of researching on MEMS micro sensors and MEMS micro actuators manufactured based on silicon material and bulk silicon technology, relatively mature design method and process basic have existed, and begun to industrialize. Silicon material and bulk silicon technology is one of the important research areas of MEMS technology. The photo lithographic process of bulk silicon technology is different from that of IC technology.

In very large scale integration manufacturing process, deep trench isolation technology of silicon has become a necessary means to promote a higher level development of IC industry. Implementing the deep trench isolation technology in a complementary metal oxide semiconductor (CMOS) can effectively overcome the latch-up effect; while implemented in a bipolar circuit, it can greatly reduce the parasitic capacitance, and the increases breakdown voltage; and in a dynamic random access memory (DRAM) with more than four megabytes of storage space, the deep trench isolation technology is implemented to make the storage capacitor. All these applications depend on whether a deep trench can be obtained or not.

Deep reactive ion etching (DRIE) can obtain a high-aspect-ratio structure with a smooth surface, thus this micro fabrication technology becomes one of the mainstream technology in the fields of MEMS manufacturing.

During the corroding process of MEMS using DRIB, since the windows of the mask are different, the corrosion depths are also different. Referring to FIG. 1, using DRIE to corrode the silicon (Si), while the silicon dioxide ($SiO_2$) is the mask, because the sizes of the two windows are different (A>B), generally, the corrosion depth of A is greater than the corrosion depth of B. If the depths are different, it will impair the performance of the product.

Accordingly, it is necessary to provide a silicon etching method, so that the etched silicon trenches have the same depth.

SUMMARY OF THE INVENTION

The technical problem to be solved by the present disclosure is to provide a silicon etching method, such that when silicon trenches having different width dimensions are etched on a silicon substrate, the obtained silicon trenches will have the same depth.

To achieve the purpose, the disclosure provides a following technical solution:

A silicon etching method of etching a silicon substrate to form silicon trenches having different width dimensions includes:

S1, providing a silicon substrate;

S2, depositing a mask layer on the silicon substrate;

S3, corroding the mask layer to form windows having different width dimensions, wherein a mask layer having a certain thickness is reserved at least at a bottom portion of a window having a non-minimum width dimension, such that all the silicon trenches have the same depth after step S4; and S4, corroding the mask layer at the bottom portion of the window and the silicon substrate to form the silicon trenches.

Preferably, the mask layer is made of silicon dioxide, silicon nitride or photoresist.

Preferably, in the step S4, the mask layer is corroded at the bottom portion of the window and the silicon substrate using a deep reactive ion etching method.

Preferably, in the step S4, the mask layer is corroded at the bottom portion of the window and the silicon substrate using a fluorine-based gas.

Preferably, in the step S4, the mask layer is corroded at the bottom portion of the window and the silicon substrate using a chlorine-based gas.

Comparing to conventional methods, the advantage of the present disclosure is that the mask layer having a certain thickness is reserved at the bottom portion of the window having the non-minimum width dimension, a relatively large window is protected by the mask layer having the certain thickness, and a relatively small window is etched first, so that the finally obtained silicon trenches have the same depth.

BRIEF DESCRIPTION OF THE DRAWINGS

To illustrate the technical solutions in the embodiments of the present disclosure or in the prior art more clearly, the following briefly introduces the accompanying drawings required for describing the embodiments. The accompanying drawings in the following description show merely some embodiments of the present disclosure, and persons of ordinary skill in the art may still derive other drawings from these accompanying drawings without creative efforts.

DETAILED DESCRIPTION OF THE EMBODIMENTS

Figure 2:
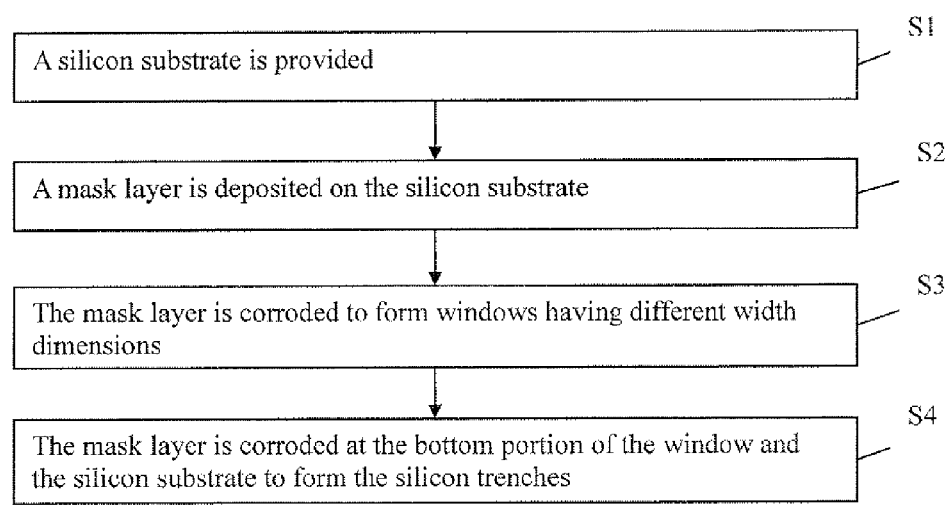
FIG. 2 is a flow chart of a silicon etching method in accordance with an embodiment.

Referring to FIG. 2, in an embodiment, the silicon etching method of etching a silicon substrate to form silicon trenches having different width dimensions includes:

S1, a silicon substrate is provided;

S2, a mask layer is deposited on the silicon substrate;

S3, the mask layer is corroded to form windows having different width dimensions, a mask layer having a certain thickness is reserved at least at a bottom portion of a window having a non-minimum width dimension, such that all the silicon trenches have the same depth after step S4; and S4, the mask layer is corroded at the bottom portion of the window and the silicon substrate to form the silicon trenches.

In the step S1, the silicon substrate has to be cleaned before being used, an RCA standard cleaning method may be used in the cleaning process.

In the step S2, the mask layer is a silicon dioxide layer. Considering the requirements of the device fabrication process, the mask layer may also be made of silicon nitride or photoresist.

In the present disclosure, the mask layer is preferably a silicon dioxide layer. The silicon dioxide layer is a dielectric film with excellent physical and chemical properties. It has a good dielectric property, low dielectric loss, and high stability, and it usually can be implemented in semiconductor devices and integrated circuits as an isolation layer, an insulating layer between polycrystalline silicon, metal and multi-layer metal wiring, a dielectric layer of the grid electrode of a MOS (Metal-Oxide Semiconductor) transistor, a mask for etching and implanting and so on. The manufacturing method of the silicon dioxide layer can use conventional, common means, such as plasma-enhanced chemical vapor deposition (PECVD), high temperature oxidation or low-pressure chemical vapor deposition (LPCVD).

In the step S3, "a mask layer having a certain thickness is reserved at least at the bottom portion of a window having a non-minimum width dimension" includes the following two situations.

(1) A mask layer having a certain thickness is also reserved at the bottom portion of the window having a minimum width dimension, while at the bottom portions of all the other windows, mask layers having other thicknesses are reserved, and the larger the window is, the thicker the mask layer is reserved at the bottom portion of the window.

(2) No mask layer having a certain thickness is reserved at the bottom portion of the window having a minimum width dimension, that is to say the silicon substrate at the bottom portion of the minimum window is exactly exposed, while at the bottom portions of all the other windows, mask layers having other thicknesses are reserved.

The forming method of the reserved mask layer includes two conditions: one is to control the depth of corrosion and persist a mask layer having a certain thickness during the corroding process of the mask layer; the other is to penetrate the mask layer and deposit a mask layer having a certain thickness at the bottom portion of the formed window, and then the mask layer in the relatively large window is photolithographed and corroded.

The thickness of the reserved mask layer can be calculated according to the size of the window, the corrosion rate of the mask layer and the corrosion rate of the silicon substrate. The relationship between the size of the window and the corrosion rate of the silicon substrate can be obtained by experiments and tests.

Figure 1:
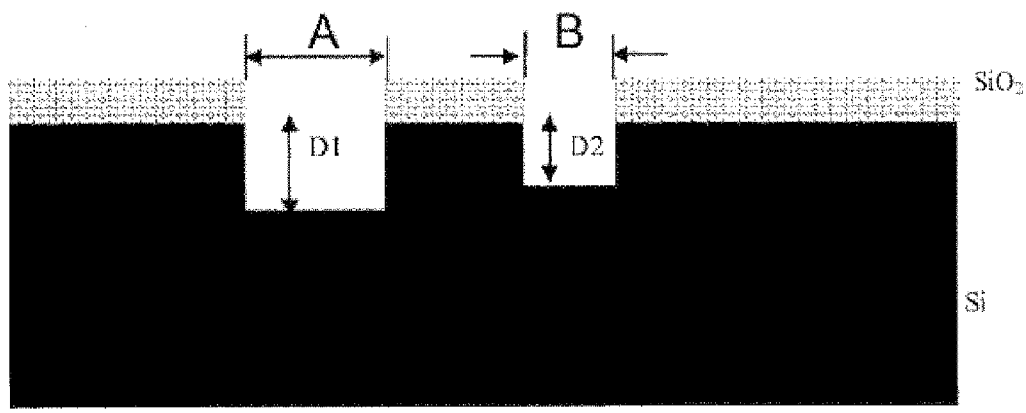
FIG. 1 is a schematic view of a silicon trench of photo lithograph in accordance with a conventional method.

Referring to FIG. 1, the relationship satisfies:

$$T_{SiO_2}=(D_1-D_2)*E_{SiO_2}/E_{Si}$$

where $T_{SiO_2}$ is the thickness of the silicon dioxide, $D_1$ and $D_2$ are the depths of the deep trenches, and $E_{SiO_2}$ and $E_{Si}$ separately represent the corrosion rate of the silicon dioxide and the corrosion rate of the silicon substrate.

In the step S4, preferably, a deep reactive ion etching (DRIE) method is used to corrode the mask layer at the bottom of the window or the silicon. In other embodiments, reactive ion etching (RIE), or commonly, fluorine-based gas or chlorine-based gas can also be used to corrode the mask layer at the bottom of the window or the silicon.

DRIE is a technology that removes etched films by combining physical process and chemical process, since it has lots of advantages, such as fast etching rate, high selection ratio, little etching damage, good uniformity of large area, high controllability of etching section profile, and smooth etching surface, DRIE technology is widely used dry etching of metal and dielectric films. DRIB has a high anisotropy, so the pattern of the etched side wall is relatively steep.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Because the rate of corroding the silicon dioxide using DRIE is relatively slow, a silicon dioxide having a certain thickness (calculated according to the corroding differences between A and B and the corrosion rate of the silicon dioxide using DRIE) should be reserved at the area having a relatively high corrosion rate. Thus, twice photolithographing processes are required to separately corrode the silicon dioxide corresponding to different windows.

Figure 3A:
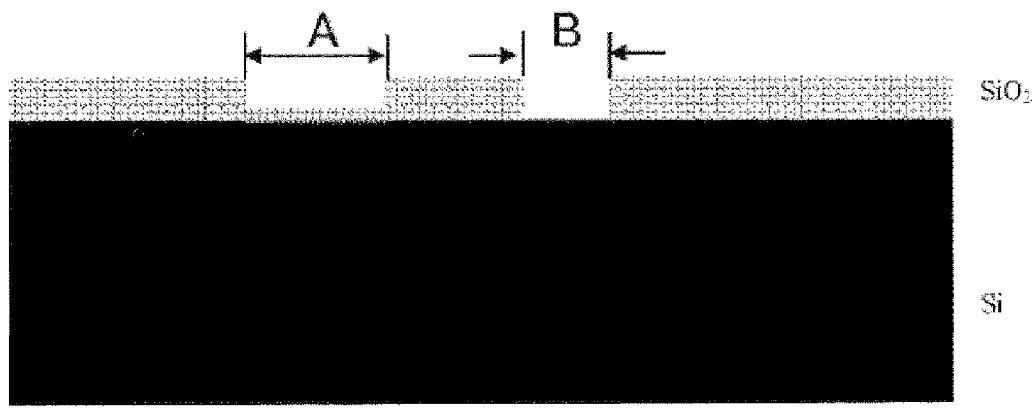
FIG. 3a to FIG. 3c are schematic views of the silicon etching method in accordance with the embodiment.

Referring to FIG. 3a, before being corroded, a silicon dioxide having a certain thickness is reserved at the bottom portion of window A, while the bottom portion of window B is exactly in contact with the silicon substrate.

Figure 3B:
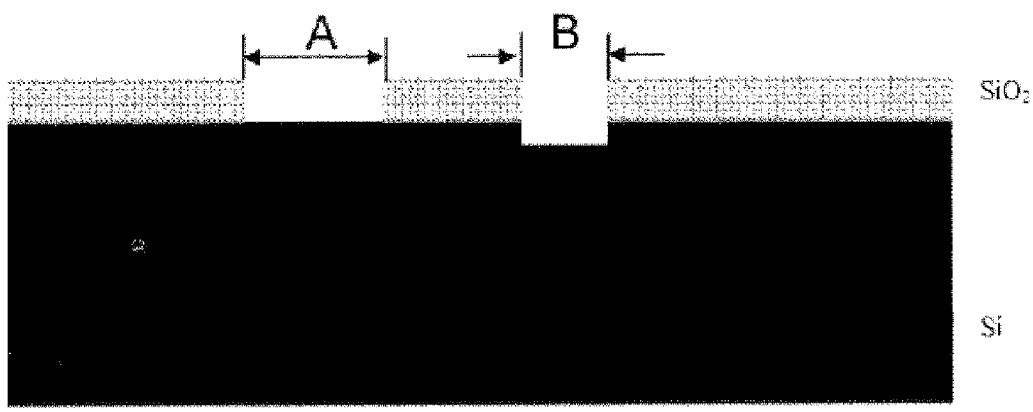

Referring to FIG. 3b, the DRIE method is used to corrode the silicon dioxide and the silicon substrate at the bottom portion of the window A and the window B. The silicon dioxide is corroded at the window A, while the silicon substrate is corroded at the window B at the same time, and when the silicon dioxide at the bottom portion of the window A is completely corroded, the silicon substrate at the bottom portion of the window B is already corroded to a certain depth.

Figure 3C:
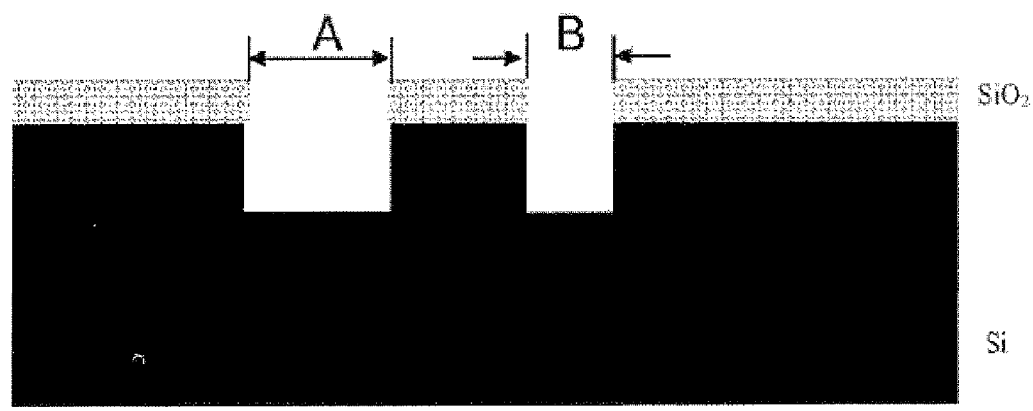

Referring to FIG. 3c, the silicon substrate at the bottom portion of the window A starts to be corroded, and the corrosion rate thereof is faster than the corrosion rate of the silicon substrate at the bottom portion of the window B. When the corrosion is over, the depth of the silicon trench under the window A exactly equals to the depth of the silicon trench under the window B.

In conclusion, the mask layer having a certain thickness is reserved at the bottom portion of the window having the non-minimum width dimension, a relatively large window is protected by the mask layer having the certain thickness, and a relatively small window is etched first, so that the finally obtained silicon trenches have the same depth.

The embodiments described above only show a few implement manners of the present invention, the description is specific and detailed, but it cannot be interpreted as a limitation of the range of the present invention. What should be pointed out is that it is apparent to those skilled in the art that a variety of modifications and changes may be made without departing from the scope of the present invention. Thus, the range of the present invention should be defined by the appended claims.

What is claimed is:

1. A silicon etching method of etching a silicon substrate to form silicon trenches having different width dimensions, comprising:
    S1, providing a silicon substrate;
    S2, depositing a mask layer on the silicon substrate;
    S3, corroding the mask layer to form windows in the mask layer having different width dimensions, wherein a mask layer having a certain thickness is reserved at least at a bottom portion of a window having a non-minimum width dimension, such that all the silicon trenches have the same depth after step S4; and
    S4, corroding the mask layer at the bottom portion of the window and the silicon substrate to form the silicon trenches;
    wherein in the step S3, the mask layers having certain thicknesses are reserved at the bottom portions of all the windows, and the larger the size of the window is, the thicker the mask layer is reserved at the bottom portion of the window;
    wherein the relationship between a size of the window and a corrosion rate of the silicon substrate is defined by:

$$T_{SiO2}=(D_1-D_2)*E_{SiO2}/E_{Si}$$

where $T_{SiO2}$ is a thickness of the silicon dioxide, $D_1$ and $D_2$ are the depths of the silicon trenches, $E_{SiO2}$ is the corrosion rate of the silicon dioxide, and $E_{Si}$ is the corrosion rate of the silicon substrate.

2. The silicon etching method according to claim 1, wherein the mask layer is made of silicon dioxide, silicon nitride or photoresist.

3. The silicon etching method according to claim 1, wherein in the step S4, the mask layer at the bottom portion of the window and the silicon substrate are corroded using a deep reactive ion etching method.

4. The silicon etching method according to claim 1, wherein in the step S4, the mask layer at the bottom portion of the window and the silicon substrate are corroded using a fluorine-based gas.

5. The silicon etching method according to claim 4, wherein prior to the step S1, the method further comprises: cleaning the silicon substrate.

6. The silicon etching method according to claim 5, wherein the silicon substrate is cleaned using an RCA standard cleaning method.

7. The silicon etching method according to claim 1, wherein in the step S4, the mask layer at the bottom portion of the window and the silicon substrate are corroded using a chlorine-based gas.

8. The silicon etching method according to claim 7, wherein prior to the step S1, the method further comprises: cleaning the silicon substrate.

9. The silicon etching method according to claim 8, wherein the silicon substrate is cleaned using an RCA standard cleaning method.

10. The silicon etching method according to claim 1, wherein prior to the step S1, the method further comprises: cleaning the silicon substrate.

11. The silicon etching method according to claim 10, wherein the silicon substrate is cleaned using an RCA standard cleaning method.

12. The silicon etching method according to claim 1, wherein in the step S3, the silicon substrate at the bottom portion of a minimum window is exposed, and the mask layers having certain thicknesses are reserved at the bottom portion of all the other windows, and the larger the window is, the thicker the mask layer is reserved at the bottom portion of the window.

* * * * *